(12) United States Patent
Tanaka (10) Patent No.: US 6,867,482 B2
(45) Date of Patent: Mar. 15, 2005

(54) TAPE CARRIER TYPE SEMICONDUCTOR DEVICE, METHOD FOR MANUFACTURING THE SAME, AND FLEXIBLE SUBSTRATE

(75) Inventor: Hideki Tanaka, Tokyo (JP)

(73) Assignee: NEC LCD Technologies, Ltd., Kanagawa (JP)

( * ) Notice: Subject to any disclaimer, the term of this patent is extended or adjusted under 35 U.S.C. 154(b) by 90 days.

(21) Appl. No.: 09/788,503

(22) Filed: Feb. 21, 2001

(65) Prior Publication Data

US 2001/0018225 A1 Aug. 30, 2001

(30) Foreign Application Priority Data

Feb. 22, 2000 (JP) .......................................... 2000-044203

(51) Int. Cl.[7] ........................................... H01L 23/495
(52) U.S. Cl. ........................................ 257/668; 257/669
(58) Field of Search ................................ 257/668, 669, 257/E23.065, E23.177, 704; 438/106; 361/183; 349/84, 158

(56) References Cited

U.S. PATENT DOCUMENTS

| | | | | |
|---|---|---|---|---|
| 5,153,705 A | * | 10/1992 | Fukuta et al. | 257/668 |
| 5,362,547 A | * | 11/1994 | Yamazaki | 428/167 |
| 5,822,191 A | * | 10/1998 | Tagusa et al. | 361/751 |
| 6,016,176 A | * | 1/2000 | Kim et al. | 349/84 |
| 6,486,544 B1 | * | 11/2002 | Hashimoto | 257/686 |
| 6,559,522 B1 | * | 5/2003 | Kang | 257/668 |
| 6,670,696 B2 | * | 12/2003 | Toyosawa et al. | 257/667 |
| 6,727,577 B2 | * | 4/2004 | Kang | 257/690 |
| 2001/0009299 A1 | * | 7/2001 | Saito | 257/684 |
| 2002/0033524 A1 | * | 3/2002 | Toyosawa et al. | 257/678 |
| 2003/0030137 A1 | * | 2/2003 | Hashimoto | 257/690 |
| 2003/0081392 A1 | * | 5/2003 | Cady et al. | 361/767 |
| 2004/0000707 A1 | * | 1/2004 | Roper et al. | 257/686 |

FOREIGN PATENT DOCUMENTS

| | | | |
|---|---|---|---|
| JP | 57-147263 | 9/1982 | |
| JP | 5-190593 | 7/1993 | |
| JP | 05-323355 | * 12/1993 | ......... G02F/1/1345 |
| JP | 6-7242 | 1/1994 | |
| JP | 6-196609 | * 7/1994 | |
| JP | 06-301047 | 10/1994 | |
| JP | 7-7143 | 1/1995 | |
| JP | 10-319425 | 12/1998 | |
| JP | 11-102938 | 4/1999 | |
| JP | 11-121682 | 4/1999 | |
| JP | 11-312715 | 11/1999 | |

OTHER PUBLICATIONS

Korean Office Action dated Aug. 26, 2002 with partial translation.
Japanese Office Action dated Jan. 13, 2004, with partial English translation.
Japanese Office Action dated Dec. 3, 2002 with partial English translation.

* cited by examiner

Primary Examiner—W. David Coleman
Assistant Examiner—Khiem Nguyen
(74) Attorney, Agent, or Firm—McGinn & Gibb, PLLC (57) ABSTRACT

A tape carrier type semiconductor device includes a flexible substrate, on which a driver circuit is mounted and on whose surface wiring is formed. Formed in the flexible substrate are the first slit for releasing external stress and the second slit for folding the tape carrier type semiconductor device. A connector for connecting both sides of the first slit is prepared at the center of the slit, whereby the unnecessary warp of the tape carrier type semiconductor device can be reduced.

31 Claims, 10 Drawing Sheets

TAPE CARRIER TYPE SEMICONDUCTOR DEVICE, METHOD FOR MANUFACTURING THE SAME, AND FLEXIBLE SUBSTRATE

BACKGROUND OF THE INVENTION

1. Field of the Invention

The present invention relates to a tape carrier type semiconductor device and a manufacturing method thereof. The present invention relates also to a flexible substrate.

2. Description of the Related Art

A tape carrier type semiconductor device is employed, for example, in a liquid crystal display of notebook computers.

Figure 10A:
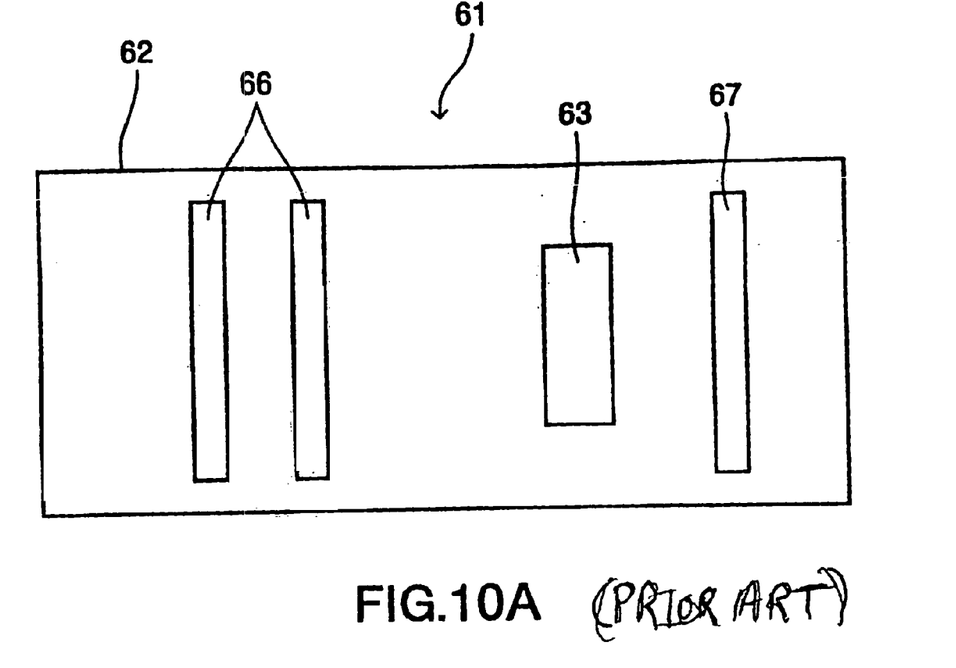
FIGS. 10A and 10B are diagrams each showing the structure of a conventional tape carrier type semiconductor device.

For example, as shown in FIG. 10A, a tape carrier-type semiconductor device 61 is formed by a flexible substrate 62, on which a driver IC 63 for driving a liquid crystal display is mounted.

The flexible substrate 62 has folding slits 66 and a stress-releasing slit 67.

The tape carrier type semiconductor device 61 is folded positions where the folding slits 66 are formed. One end of the tape carrier type semiconductor device 61 is connected to a liquid crystal panel, and the other end thereof is connected to a print substrate to be arranged on the back surface of the liquid crystal panel.

The stress-releasing slit 67 is formed to prevent the tape carrier type semiconductor device 61 from being detached from the print substrate. Particularly, the stress-releasing slit 67 releases mechanical stress put on the connection part of the tape carrier type semiconductor device 61 and the print substrate.

Wiring is formed on the flexible substrate 62, so that the driver IC 63, the liquid crystal panel, and the print substrate are electrically connected. A resin for preventing breakage of wiring is applied onto one surface of the flexible substrate 62, while a solder resist for preventing a short circuit between wiring pieces, which may be caused by the solder, is applied onto the other side surface of the flexible substrate 62.

Figure 10B:
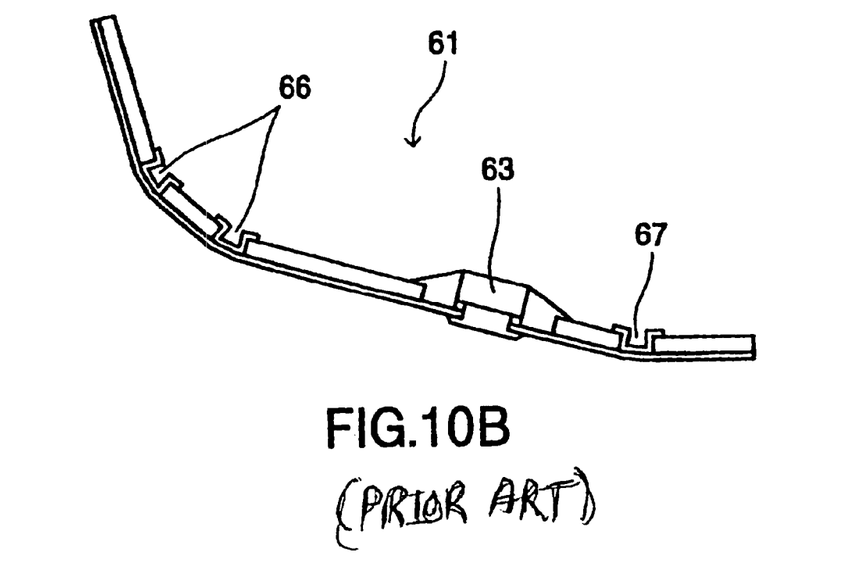

The resin and the solder resist applied onto the flexible substrate 62 have different heat expansion coefficients. Hence, the tape carrier type semiconductor device 61 may be warped, as shown in FIG. 10B, as a result of heat applied thereto while manufacturing the tape carrier type semiconductor device 61.

If the tape carrier type semiconductor device 61 is dramatically warped, the tape carrier type semiconductor device 61 may be in contact with an arm for connecting the tape carrier type semiconductor device 61, the liquid crystal panel, and the print substrate. If this interference occurs, the tape carrier type semiconductor device 61, the liquid crystal panel, and the print substrate may not desirably be connected.

A technique for preventing such a warp in a tape carrier type semiconductor device is disclosed Unexamined Japanese Patent Application KOKAI Publication No. H5-190593.

According to the technique disclosed in the publication, in order to prevent the warp in the tape carrier type semiconductor device, it is necessary to newly form a slit, and to attach a reinforcement plate, which is harder than the flexible substrate, to the tape carrier type semiconductor device.

The problem in the technique of the above publication is that the tape carrier type semiconductor device is more likely to be warped, since a new slit is formed. In addition, because a reinforcement plate is additionally attached thereto, the number of parts in the tape carrier type semiconductor device increases, and the number of processes for manufacturing the same increases, as well.

The entire contents of the above publication are incorporated herein by reference in its entirety.

SUMMARY OF THE INVENTION

It is accordingly an object of the present invention to provide a tape carrier type semiconductor device which can easily be manufactured and is unlikely to be warped, and a method for manufacturing the same.

Another object thereof is to provide a flexible substrate which can easily be manufactured and is unlikely to be warped.

In order to achieve the above objects, according to the first aspect of the present invention, there is provided a tape carrier type semiconductor device comprising:

a flexible substrate on whose surface wiring is formed; and a driver circuit which is mounted on said flexible substrate and drives a device connected to said flexible substrate, and wherein said flexible substrate includes a first slit having a connector for connecting both sides of the first slit.

According to this invention, in the structure where the flexible substrate includes the first slit having the connector for connecting both sides of the first slit, the amount of warp in the tape carrier type semiconductor device can be reduced. This enables to provide the tape carrier type semiconductor device which can easily be manufactured and is unlikely to be warped.

The first slit may include a plurality of connectors.

Parts of the slit, which are separated from each other at the connector, may be diverged from each other at the connector in a direction perpendicular to the slit.

The flexible substrate may include a plurality of first slits.

The flexible substrate may include a second slit for folding said tape carrier type semiconductor device.

The flexible substrate may include a rib which is formed substantially perpendicular to the plurality of first slits.

A portion of said flexible substrate may be changed in shape, thereby to form the rib.

According to the second aspect of the present invention, there is provided a tape carrier type semiconductor device comprising:

a flexible substrate on whose surface wiring is formed; and a driver circuit which is mounted on said flexible substrate and drives a device connected to said flexible substrate, and wherein said flexible substrate includes a slit for folding said flexible substrate and a rib which is formed substantially perpendicular to the slit.

A portion of said flexible substrate is changed in shape, thereby to form the rib.

According to the third aspect of the present invention, there is provided a method for manufacturing a carrier type semiconductor device, comprising forming a rib for reducing a warp of a flexible film on and in which a driver circuit and a slit are formed, by changing a shape of the flexible film, when the flexible film is cut into a predetermined length.

According to the fourth aspect of the present invention, there is provided a flexible substrate, which includes a first slit having a connector for connecting both sides of the first slit, and on whose surface wiring having a predetermined pattern is formed.

The first slit may include a plurality of connectors.

Parts of the slit, which are separated from each other at the connector, are diverged from each other at the connector in a direction perpendicular to the slit.

The flexible substrate may further comprise a second slit for folding said flexible substrate.

The flexible substrate may further comprise a rib formed substantially perpendicular to the first slit.

A portion of said flexible substrate may be changed in shape, thereby to form the rib.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS

A tape carrier type semiconductor device according to the first embodiment of the present invention will now be described with reference to the accompanying drawings.

Figure 1A:
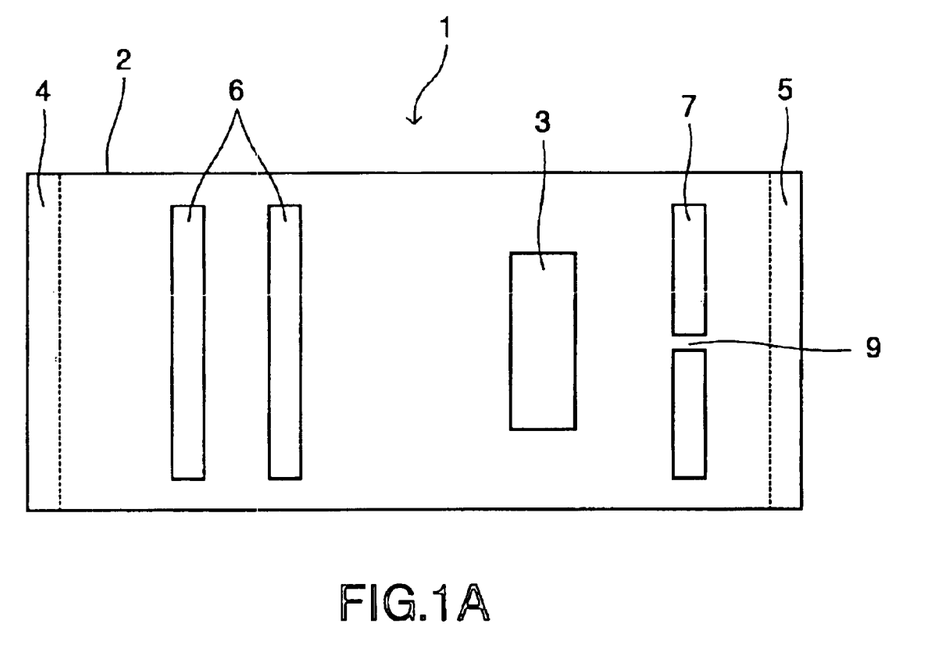
FIGS. 1A and 1B are diagrams each showing the structure of a tape carrier type semiconductor device according to the first embodiment of the present invention.
Figure 1B:
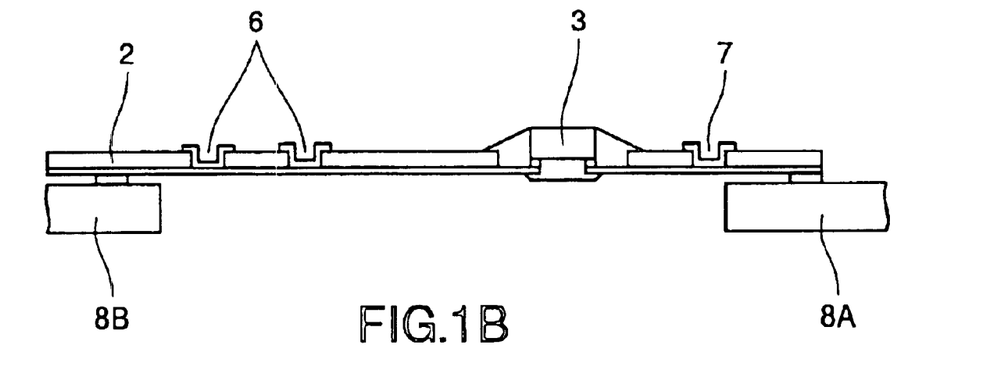

A tape carrier type semiconductor device 1 of the first embodiment is formed by a flexible substrate 2, on which a driver IC 3 for driving a liquid crystal display is mounted, as shown in FIGS. 1A and 1B.

For example, the flexible substrate 2 is composed of a polyimide resin film, which is approximately 0.2 mm in thickness, and wiring having a predetermined pattern formed on the polyimide resin film. Other than the polyimide resin film, the flexible substrate 2 may include an organic polymer film, such as a polyamide resin film, a polyester resin film, etc., or a composite film formed in combination of them.

Outer terminals (not illustrated) to be connected to a liquid crystal panel 8B are formed on one terminal (terminal area 4) of the flexible substrate 2. Outer terminals (not illustrated) to be connected to a print substrate 8A are formed on a distal terminal (terminal area 5) of the flexible substrate 2.

Figure 2:
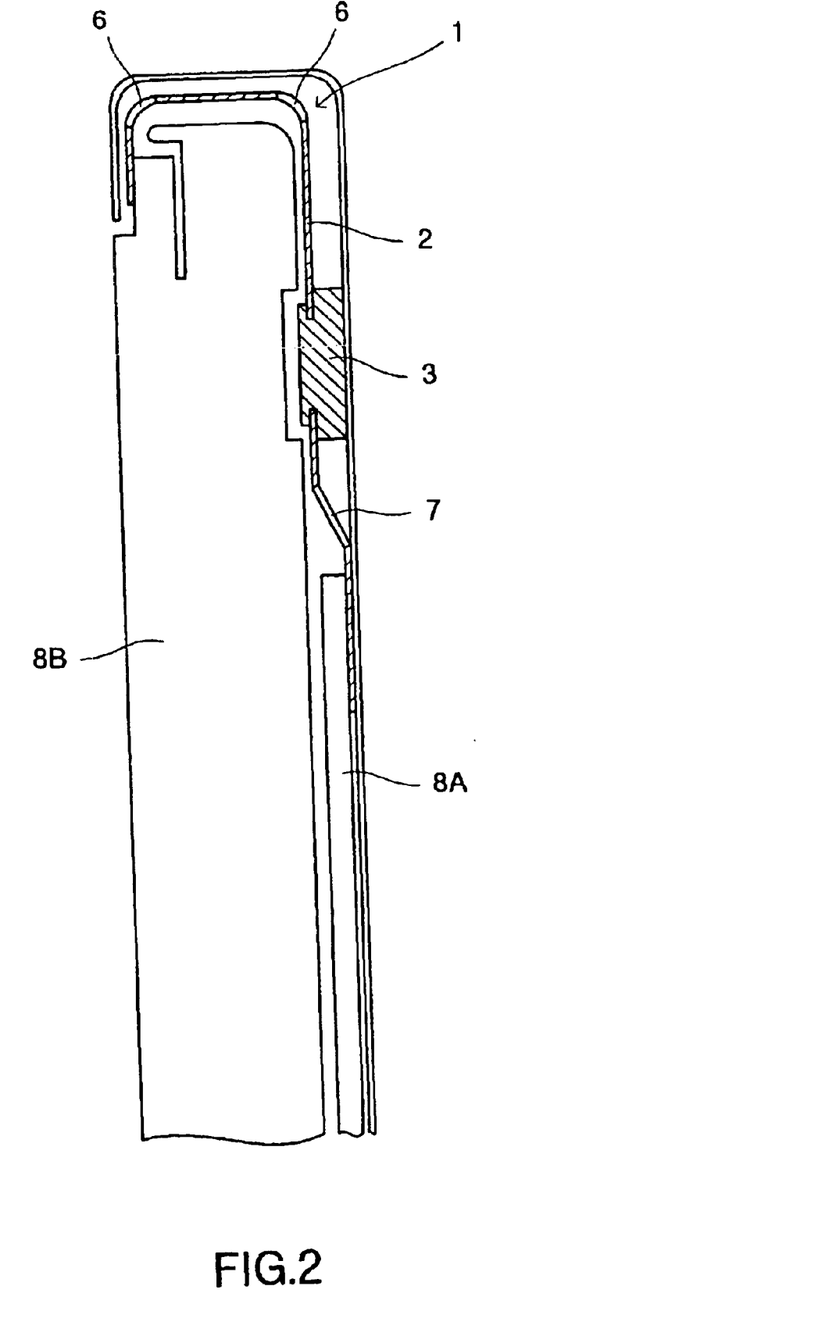
FIG. 2 is a diagram showing the state in which the tape carrier type semiconductor device of FIGS. 1A and 1B is mounted on a liquid crystal display.

The flexible substrate 2 has folding slits 6 and a stress-releasing slit 7. As shown in FIG. 2, the folding slits 6 are prepared, for example, for folding the tape carrier type semiconductor device 1, when assembling a liquid crystal display.

The stress-releasing slit 7 is formed between the driver IC3 and the terminal area 5, in a rectangular shape whose longitudinal side is parallel to the terminal area 5. The stress-releasing slit 7 reduces mechanical stress on connection parts of the outer terminals and the respective print substrate 8A and the liquid crystal panel 8B. The stress-releasing slit 7 prevents the outer terminals from being detached from the print substrate 8A and the liquid crystal panel 8B, respectively.

As shown in FIG. 1A, a bridge 9 for connecting both sides of the stress-releasing slit 7 is arranged at center of the stress-releasing slit 7.

A solder resist is uniformly applied onto one surface of the flexible substrate 2 onto which the print substrate 8A and the liquid crystal panel 8B are connected, except onto a portion where the driver IC 3 is arranged, thereby preventing a short circuit between wiring pieces, as may be caused by solder adhered onto the wiring pieces. A resin for preventing breakage of the wiring pieces is applied onto a portion of the other surface of the flexible substrate 2, on which the folding slits 6 and the stress-releasing slit 7 are formed.

As described above, the bridge 9 is arranged at the center of the stress-releasing slit 7. In this structure, the rigidity of the tape carrier type semiconductor device 1 increases. In addition, a warp of the tape carrier type semiconductor device 1, which is caused as a result of a difference in heat expansion coefficients of the breakage preventing resin and the solder resist, is restrained.

Thus formed tape carrier type semiconductor device 1 is formed, by cutting the flexible film in the form of a tape with the driver ICs 3 into a predetermined length.

Explanations will now be made to the structure where the warp of the tape carrier type semiconductor device 1 is restrained by the effect of the bridge 9 over the stress-releasing slit 7.

Figure 3:
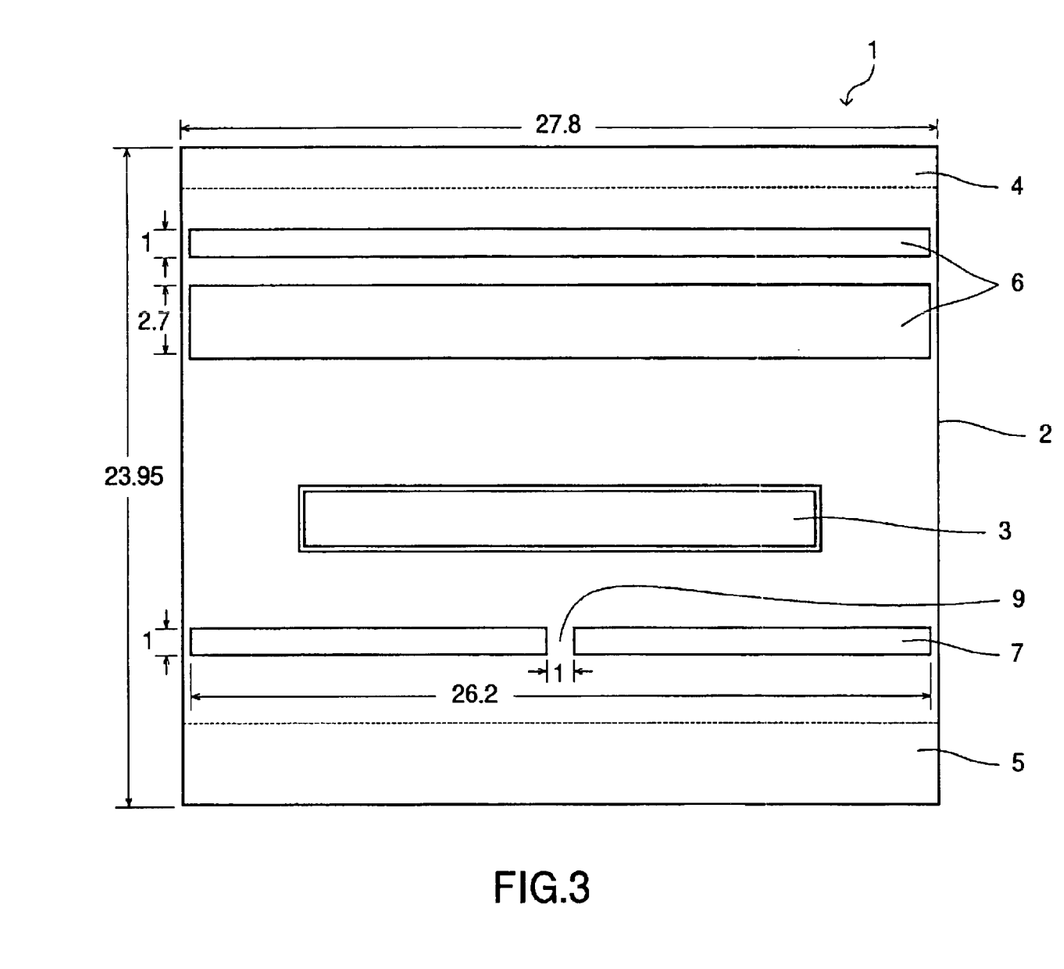
FIG. 3 is a diagram showing the size of the tape carrier type semiconductor device according to the first aspect of the present invention.

FIG. 3 is a plan view showing the size of the manufactured tape carrier type semiconductor device 1.

The flexible substrate 2 is formed using polyimide resin film which is 0.2 mm in thickness.

As seen from FIG. 3, the length of the tape carrier type semiconductor device 1 is 23.95 mm, and the width is 27.8 mm. The length of the stress-releasing slit 7 is 26.2 mm, and the width is 1.0 mm. The width of the bridge 9 for connecting the both sides of the stress-releasing slit 7 is 1.0 mm.

The amount of warp of the tape carrier type semiconductor device 1 having the above-described size is measured. Particularly, one of the terminal areas 4 and 5 is fixed, and the shift amount of the other one, which is shifted from its original position, are measured. Note that the original position is the position of the other one of the terminal areas 4 and 5, when the tape carrier type semiconductor device 1 has not been warped.

As a comparative example, the amount of warp of the tape carrier type semiconductor device without the bridge 9 is also measured in the same condition as above.

The amount of warp of the tape carrier type semiconductor device without the bridge 9 is approximately 7.2 mm. This amount of warp is equivalent to approximately 30% of the length of the tape carrier type semiconductor device. On the other hand, the amount of warp of the tape carrier type semiconductor device 1 including the bridge 9 is approximately 1.15 mm. This amount of warp is equivalent to approximately 4.8% of the length of the tape carrier type semiconductor device.

As obvious from the above results, having arranged the bridge 9 across the stress-releasing slit 7, the warp of the tape carrier type semiconductor device 1 can be reduced. The amount of the warp of the tape carrier type semiconductor device 1 including the bridge 9 stays in a range that the arm and the tape carrier type semiconductor device 1 are not in contact with each other within an automatic mounting device for mounting the tape carrier type semiconductor device 1 onto the liquid crystal panel 8B.

According to the above structure where the bridge 9 for connecting both sides of the stress-releasing slit 7 is arranged at the center of the stress-releasing slit 7, the warp of the tape carrier type semiconductor device 1 can be reduced. Because only the bridge 9 is additionally arranged at the center of the stress-releasing slit 7, the processes for manufacturing the tape carrier type semiconductor device 1 will not be complicated.

A tape carrier type semiconductor device according to the second embodiment of the present invention will now be explained with reference to the accompanying drawings.

Figure 4A:
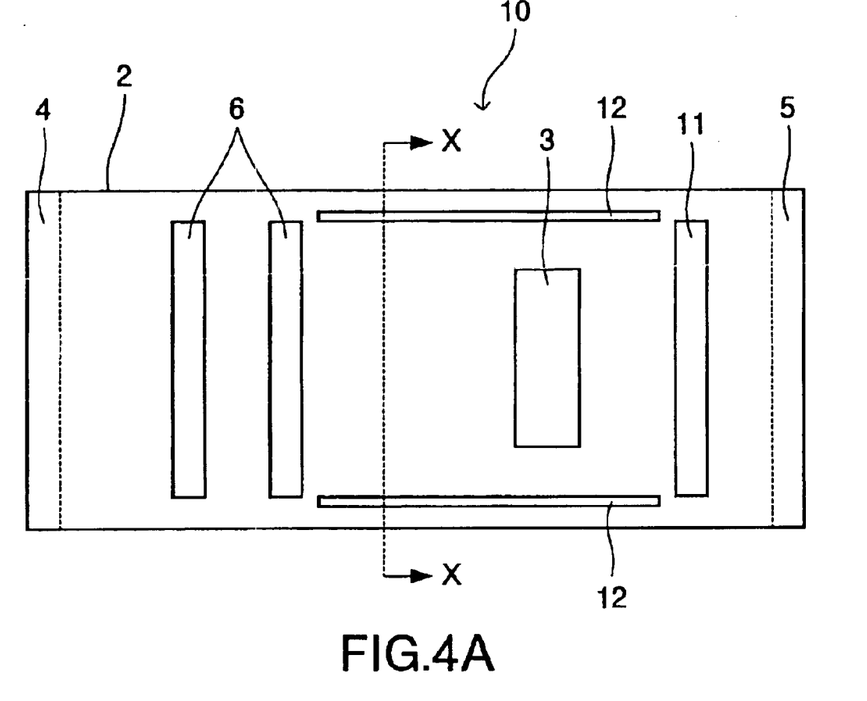
FIG. 4A is a plan view showing the structure of a tape carrier type semiconductor device according to the second embodiment.

As illustrated in FIG. 4A, a tape carrier type semiconductor device 10 according to the second embodiment of the present invention is formed by the flexible substrate 2 on which the driver IC 3 is mounted, likewise the structure of the tape carrier type semiconductor device 1 described in the first embodiment.

Figure 4B:
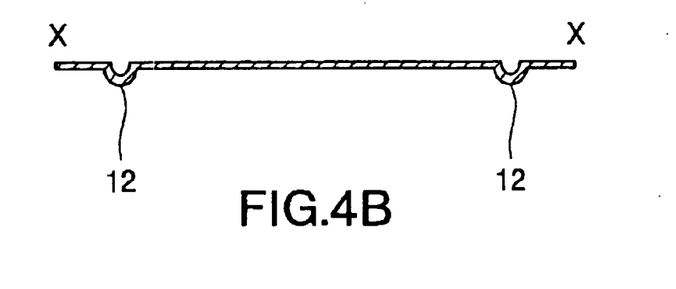
FIG. 4B is a cross sectional view taken along a line X—X of FIG. 4A.

Note that the flexible substrate 2 includes a stress-releasing slit 11 without the bridge 9, in place of the stress-releasing slit 7 with the bridge 9, as shown in FIGS. 4A and 4B. The flexible substrate 2 includes reinforcement ribs 12 for reducing the warp of the tape carrier type semiconductor device 10. The reinforcement ribs 12 may be formed in a concave or convex shape.

Any other structure of the tape carrier type semiconductor device 10 is substantially the same as that described in the first embodiment.

As shown in FIG. 4A, the reinforcement ribs 12 are prepared perpendicular to the folding slits 6 and the stress-releasing slit 11 therebetween. These reinforcement ribs 12 are formed when the flexible film in the form of a tape is cut into individual tape carrier type semiconductor device 10.

Figure 5A:
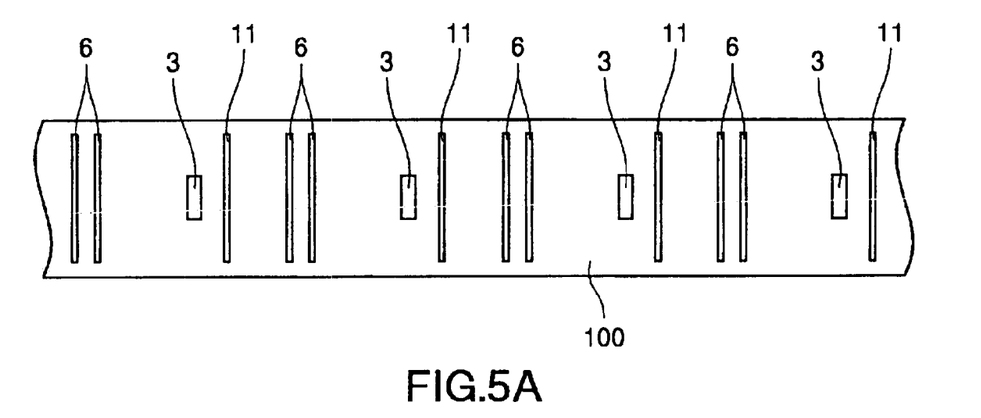
FIG. 5A is a plan view showing the structure of a flexible film before being divided into a plurality of tape carrier type semiconductor devices, respectively.
Figure 5B:
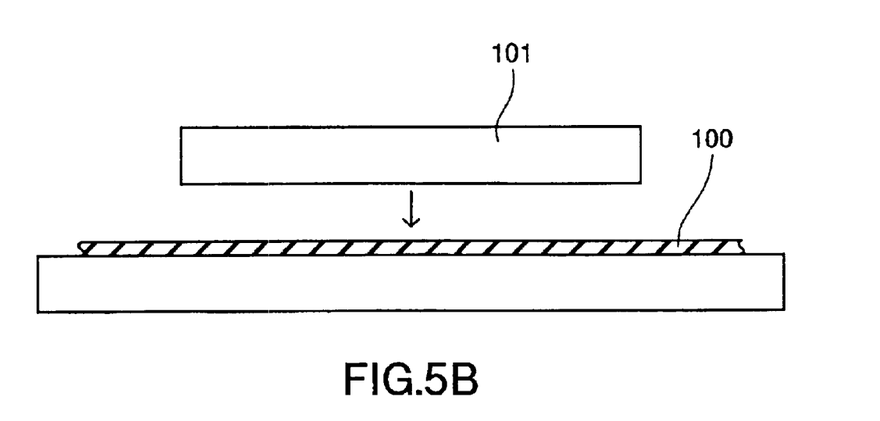
FIG. 5B is a diagram showing the state in which the flexible film is pressed using a metal pattern.

For example, as shown in FIG. 5A, the driver ICs 3 are mounted onto a flexible film 100 at predetermined intervals, and the folding slits 6 and the stress-releasing slits 11 are formed at predetermined intervals as well. As shown in FIG. 5B, the flexible film 100 is cut off in predetermined length, by pressing the flexible film 100 using a metal pattern 101, thereby forming the tape carrier type semiconductor device 10. The metal pattern 101 has a portion which is formed in a concave or convex shape, as well as the reinforcement ribs 12. Hence, when pressing the flexible film 100 using the metal pattern 101, the reinforcement ribs 12 are formed. Accordingly, the flexible substrate 2 has the portion in the form of a concave or convex shape, thereby to form the reinforcement ribs 12.

Accordingly, a pair of reinforcement ribs 12 are prepared perpendicular to the folding slits 6 and the stress-releasing slit 11. In this structure, the warp of the tape carrier type semiconductor device 10, which is caused by a difference in heat expansion coefficients of the breakage preventing resin and the solder resist, can be reduced. Since the reinforcement ribs 12 can be formed only by pressing the flexible substrate 2, the processes for manufacturing the tape carrier type semiconductor device 10 will not be complicated.

The structure of the tape carrier type semiconductor device 1 has been explained only by way of example. Changes may be made thereto, as long as the flexibility for preventing the detachment of the outer terminal can be maintained.

Figure 6A:
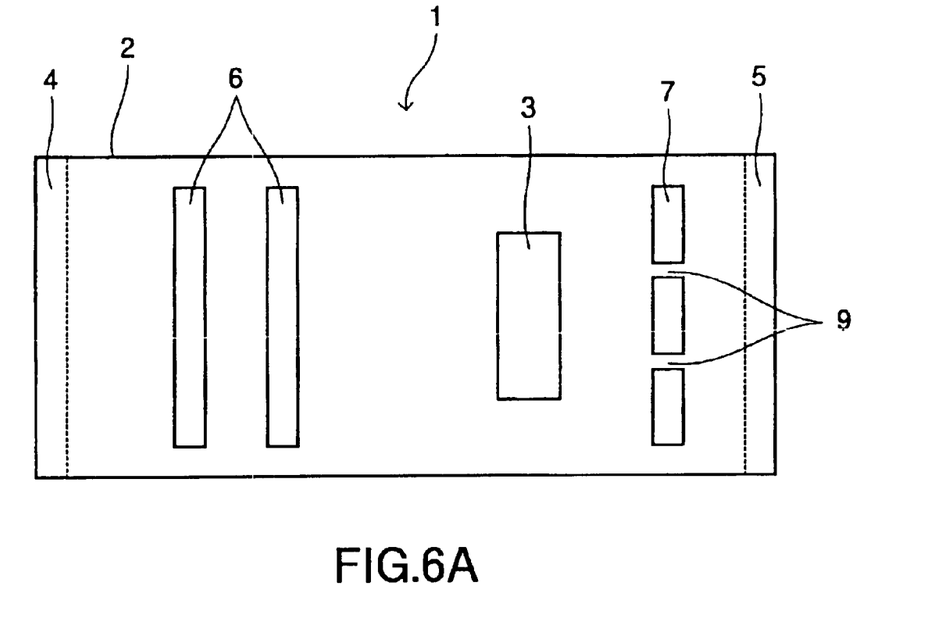
FIGS. 6A and 6B are diagrams each showing another structure of the tape carrier type semiconductor device according to the first embodiment.
Figure 6B:
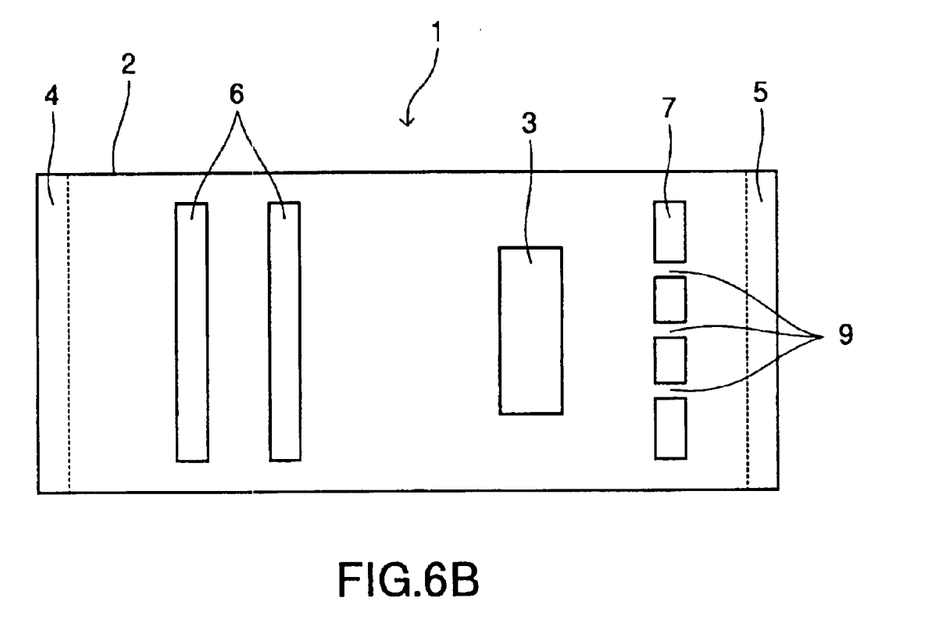
Figure 7A:
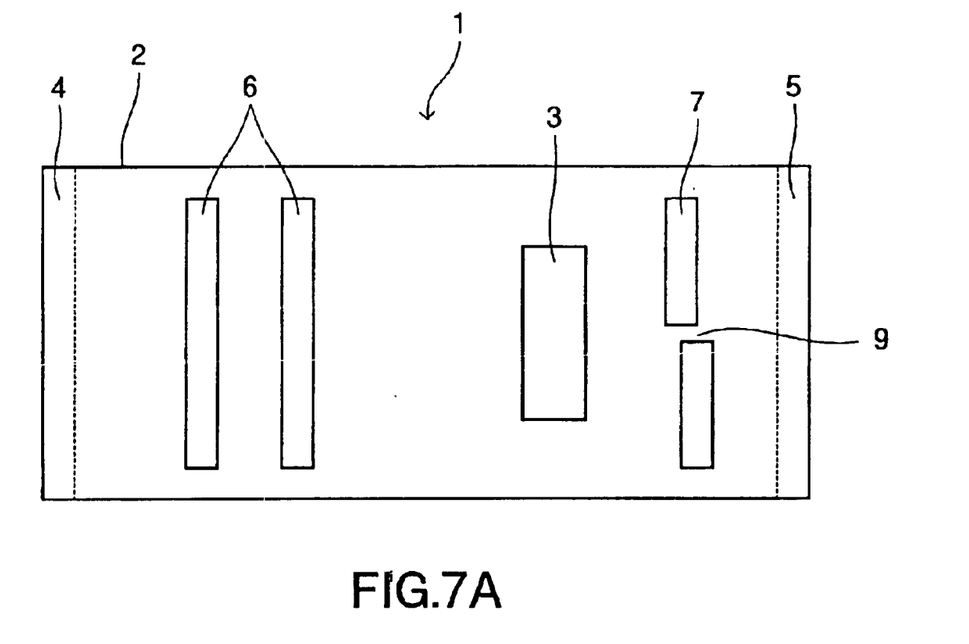
FIGS. 7A and 7B are diagrams each showing still another structure of the tape carrier type semiconductor device according to the first embodiment.
Figure 7B:
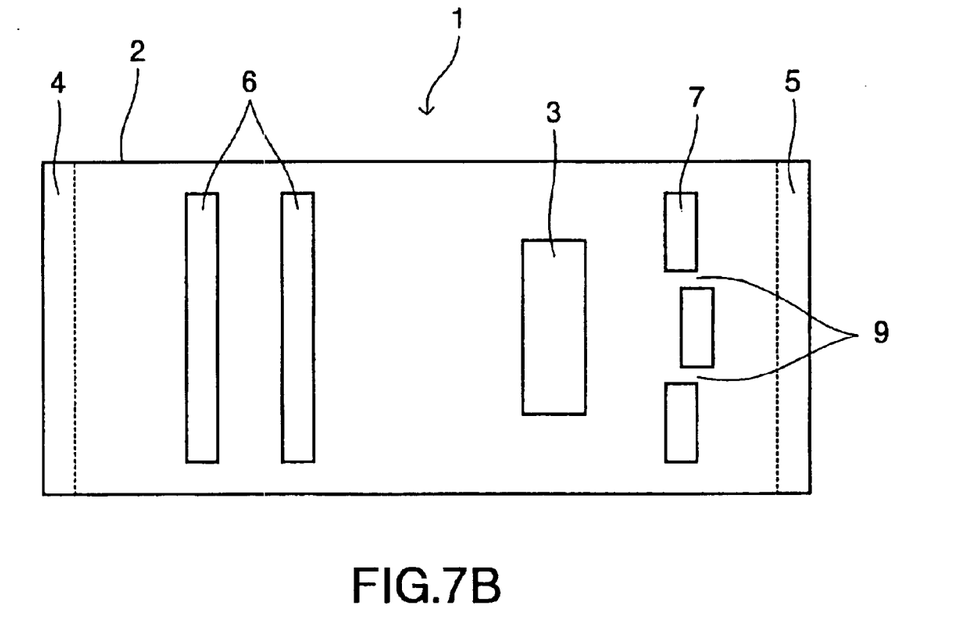
Figure 8:
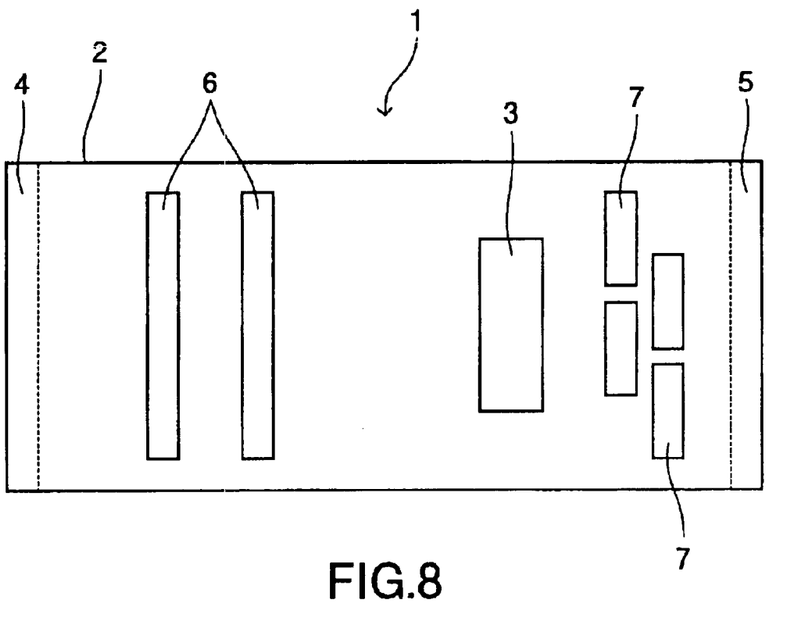
FIG. 8 is a diagram showing still yet another structure of the tape carrier type semiconductor device according to the first embodiment.

For example, as shown in FIGS. 6A and 6B, a plurality of bridges 9 may be prepared over the stress-releasing slit 7. The slits forming the stress-releasing slit 7 may be diverged from a straight line, as illustrated in FIGS. 7A and 7B. As seen from FIG. 8, a plurality of stress-releasing slits 7 may be formed, and may be diverged as shown in FIG. 8.

Figure 9:
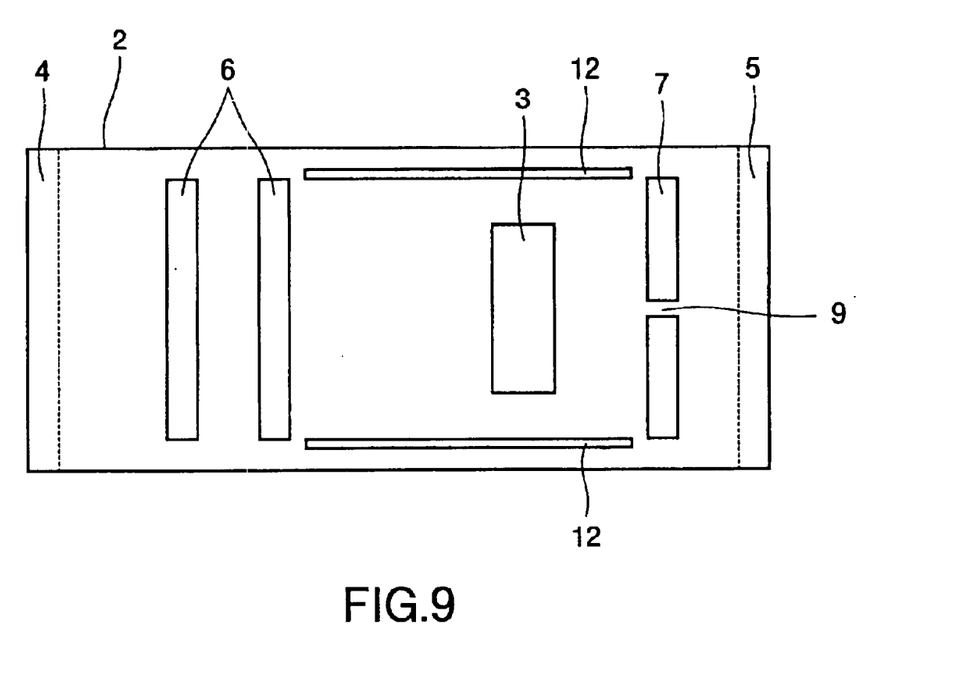
FIG. 9 is a diagram showing further structure of the type carrier type semiconductor device according to the first and second embodiments.

The structure of the tape carrier type semiconductor device 1 according to the first embodiment and the structure of the tape carrier type semiconductor device 10 according to the second embodiment may be combined together. For example, as shown in FIG. 9, the flexible substrate 2 may include the stress-releasing slit 7 with the bridge 9 and the reinforcement ribs 12 together. In this structure, the warp of the tape carrier type semiconductor device can further be reduced.

Needless to say, the present invention can applied not only to the above-described liquid crystal display, but also to an IC for watches or any other external devices.

Various embodiments and changes may be made thereonto without departing from the broad spirit and scope of the invention. The above-described embodiments are intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. 2000-044203 filed on Feb. 22, 2000, and including specification, claims, drawings and summary. The disclosure of the above Japanese Patent Application is incorporated herein by reference in its entirety.

What is claimed is:

1. A tape carrier type semiconductor device comprising:
   a flexible substrate on whose surface wiring is formed; and
   a driver circuit which is mounted on said flexible substrate and drives a device connected to said flexible substrate,
   wherein said flexible substrate includes:
      a first slit for releasing stress, said first slit having a connector for connecting parts of the first slit and separating said parts in a width-wise direction of said flexible substrate; and
      a second slit having no connector, for folding said flexible substrate.

2. The tape carrier type semiconductor device according to claim 1, wherein said connector comprises a plurality of connectors.

3. The tape carrier type semiconductor device according to claim 2, wherein said parts of the slit, which are separated from each other at the connector, are diverged from each other at the connector in a direction perpendicular to the slit.

4. The tape carrier type semiconductor device according to claim 3, wherein said first slit comprises a plurality of first slits.

5. The tape carrier type semiconductor device according to claim 4, wherein said second slit comprises a plurality of second slits.

6. The tape carrier type semiconductor device according to claim 4, wherein said flexible substrate includes a rib which is formed substantially perpendicular to the plurality of first slits.

7. The tape carrier type semiconductor device according to claim 4, wherein a portion of said flexible substrate is changed in shape, thereby to form a rib.

8. The tape carrier type semiconductor device according to claim 1, wherein said flexible substrate includes a rib formed substantially perpendicular to the first slit.

9. The tape carrier type semiconductor device according to claim 1, wherein a portion of said flexible substrate is changed in shape, thereby to form a rib.

10. The tape carrier type semiconductor device according to claim 1, wherein said flexible substrate comprises at least one of a polyimide resin film, an organic polymer film, a polyamide resin film, a polyester resin film and a composite film.

11. The tape carrier type semiconductor device according to claim 1, wherein said flexible substrate comprises a terminal area adjacent said first slit.

12. The tape carrier type semiconductor device according to claim 11, wherein said first slit is situated between said driver circuit and said terminal area, said first slit comprises a rectangular shape with a longitudinal side parallel to said terminal area.

13. The tape carrier type semiconductor device according to claim 1, wherein a warpage of said tape carrier type semiconductor device is no more than approximately 4.8% of a length of said tape carrier type semiconductor device.

14. The tape carrier type semiconductor device according to claim 1, wherein said first slit and said second slit are formed on opposing sides of said driver circuit.

15. The tape carrier type semiconductor device according to claim 1, wherein said flexible substrate comprises a resin on a first side of said flexible substrate, said resin including a first heat expansion coefficient.

16. The tape carrier type semiconductor device according to claim 15, wherein said flexible substrate comprises a solder resist on a second side of said flexible substrate, said solder resist including a second heat expansion coefficient.

17. The tape carrier type semiconductor device according to claim 1, wherein said rib comprises a reinforcement rib.

18. The tape carrier type semiconductor device according to claim 1, wherein said rib has at least one of a concave and a convex shape.

19. The tape carrier type semiconductor device according to claim 1, wherein said first slit comprises a thermal stress-releasing slit.

20. The tape carrier type semiconductor device according to claim 1, wherein said flexible substrate comprises a terminal area substantially adjacent to said first slit and said print substrate.

21. The tape carrier type semiconductor device according to claim 1, wherein said flexible substrate comprises a terminal area, said first slit is situated between said driver circuit and said terminal area.

22. The tape carrier type semiconductor device according to claim 1, wherein said first slit comprises a length of approximately 26 mm, a width of approximately 1.0 mm, and wherein said connector comprises a width of approximately 1.0 mm.

23. The tape carrier type semiconductor device according to claim 1, wherein said flexible substrate comprises a plurality of first slits, which are oriented in an off-set pattern to diverge from a straight line.

24. The tape carrier type semiconductor device according to claim 1, wherein said flexible substrate is connected to a print substrate, said first slit is substantially adjacent to said driver circuit and said print substrate.

25. A tape carrier type semiconductor device comprising:

a flexible substrate on whose surface wiring is formed; and a driver circuit which is mounted on said flexible substrate and drives a device connected to said flexible substrate, wherein said flexible substrate includes:

a first slit for releasing stress in said flexible substrate, said first slit having a connector for connecting parts of the first slit and separating said parts in a widthwise direction of said flexible substrate;

a second slit having no connector, for folding said flexible substrate; and a rib formed substantially perpendicular to the first slit.

26. The tape carrier type semiconductor device according to claim 25, a portion of said flexible substrate is changed in shape, thereby to form the rib.

27. A flexible substrate, comprising:

a first slit for releasing a stress, said first slit having a connector for connecting parts of the first slit and separating said parts in a width-wise direction of said flexible substrate, and on whose surface wiring having a predetermined pattern is formed; and a second slit having no connector, for folding said flexible substrate.

28. The flexible substrate according to claim 27, wherein said connector comprises a plurality of connectors.

29. The flexible substrate according to claim 28, wherein said parts of the slit, which are separated from each other at the connector, are diverged from each other at the connector in a direction perpendicular to the slit.

30. The flexible substrate according to claim 27, further comprising a rib formed substantially perpendicular to the first slit.

31. The flexible substrate according to claim 27, wherein a portion of said flexible substrate is changed in shape, thereby to form a rib.

* * * * *